(12) United States Patent
Kim et al.

(10) Patent No.: US 8,692,237 B2
(45) Date of Patent: Apr. 8, 2014

(54) ORGANIC LIGHT EMITTING DEVICE AND METHOD OF MANUFACTURING SAME

(75) Inventors: Jang-Joo Kim, Seoul (KR); Hyong-Jun Kim, Seoul (KR); Hwan-Hee Cho, Seoul (KR)

(73) Assignee: SNU R&DB Foundation, Seoul (KR)

( * ) Notice: Subject to any disclaimer, the term of this patent is extended or adjusted under 35 U.S.C. 154(b) by 179 days.

(21) Appl. No.: 13/142,936

(22) PCT Filed: Dec. 29, 2009

(86) PCT No.: PCT/KR2009/007900
§ 371 (c)(1),
(2), (4) Date: Jun. 30, 2011

(87) PCT Pub. No.: WO2010/077070
PCT Pub. Date: Jul. 8, 2010

(65) Prior Publication Data
US 2011/0266577 A1  Nov. 3, 2011

(30) Foreign Application Priority Data

Dec. 30, 2008  (KR) .......... 10-2008-0136593

(51) Int. Cl.
*H01L 51/00* (2006.01)

(52) U.S. Cl.
USPC  257/40; 257/98; 257/E51.019; 257/E51.021; 977/949; 977/952; 438/29

(58) Field of Classification Search
USPC .............. 257/40, 98, E51.019, E51.021; 977/949, 952; 438/29
See application file for complete search history.

(56) References Cited

U.S. PATENT DOCUMENTS

| | | | |
|---|---|---|---|
| 7,199,393 B2 | 4/2007 | Park et al. | |
| 7,473,932 B2 | 1/2009 | Cho et al. | |
| 7,759,861 B2 | 7/2010 | Fujimoto et al. | |
| 7,957,621 B2 * | 6/2011 | Zhang et al. | 385/131 |
| 2006/0115916 A1 * | 6/2006 | Lee et al. | 438/29 |
| 2006/0118803 A1 * | 6/2006 | Lee et al. | 257/98 |

(Continued)

FOREIGN PATENT DOCUMENTS

| | | |
|---|---|---|
| KR | 1020050038120 | 4/2005 |
| KR | 1020060030396 | 4/2006 |

(Continued)

*Primary Examiner* — Victor A Mandala
(74) *Attorney, Agent, or Firm* — Bacon & Thomas, PLLC

(57) ABSTRACT

An organic light emitting device enables improvement on the loss of optical extraction efficiency due to total reflection and optical waveguide effects. The organic light emitting device has a structure wherein a first electrode, an organic substance layer, and a second electrode are sequentially laminated on a substrate, a random nano structure having a fine pattern of a peaks-and-valleys shape is formed between a substrate and a first electrode to extract any light that is wasted due to total reflection and an optical waveguide mode to the outside of the substrate so that an organic light emitting device with improved external quantum efficiency can be realized, and optical extraction patterns and color changes due to visual field angles can also be improved.

16 Claims, 16 Drawing Sheets

(56) References Cited

U.S. PATENT DOCUMENTS

| | | |
|---|---|---|
| 2006/0214572 A1 | 9/2006 | Maeda |
| 2007/0170446 A1 | 7/2007 | Cho et al. |
| 2007/0254162 A1 | 11/2007 | Kozaki et al. |
| 2007/0257608 A1* | 11/2007 | Tyan et al. .................... 313/506 |
| 2010/0150513 A1* | 6/2010 | Zhang et al. .................. 385/131 |
| 2010/0245218 A1* | 9/2010 | Nasu et al. ...................... 345/80 |
| 2011/0248256 A1* | 10/2011 | Cok et al. ........................ 257/40 |
| 2011/0284907 A1* | 11/2011 | Nakamura et al. .............. 257/98 |
| 2011/0297993 A1* | 12/2011 | Cho et al. ........................ 257/98 |

FOREIGN PATENT DOCUMENTS

| | | |
|---|---|---|
| KR | 1020060090765 | 8/2006 |
| KR | 1020060103111 | 9/2006 |
| KR | 1020070074257 | 7/2007 |
| KR | 1020070102947 | 10/2007 |

* cited by examiner

ORGANIC LIGHT EMITTING DEVICE AND METHOD OF MANUFACTURING SAME

TECHNICAL FIELD

The present invention relates to organic light emitting devices; and, more particularly, to organic light emitting devices suitable for improving the extraction efficiency of the light wasted by the total reflection of light at a surface of an electrode and optical waveguide effects and to a method of manufacturing the same.

BACKGROUND ART

As well known in the art, an organic light emitting device, which is a kind of organic electronic device, is expected to become an optimal display device because it is thin and light and has relatively high luminescent efficiency and color purity. In accordance with such an expectation, organic light emitting devices are increasingly employed in portable terminals and the like.

Such an organic light emitting device generally uses the three color pixels of red, green and blue in a display drive mode. In recent years, in order to reduce the consumption of power, an organic light emitting device using white pixels together with the three color pixels has been seriously examined. Further, research into displays in which a white organic light emitting device is combined with color filters and research into a white organic light emitting device which is used as a light source of liquid crystal display are being actively conducted everywhere.

Recently, a white organic light emitting device has been researched as a surface emitting device that can replace an incandescent or fluorescent lamp. The improvement of the light extraction efficiency of a white organic light emitting device, which can be used for various purposes, enables the possibility of the white organic light emitting device being used for display or illumination becomes greater.

DISCLOSURE

Technical Problem

Though a conventional organic light emitting device has various advantages, it has a basic problem in that it has an optical waveguide structure therein. Thus, owing to the high refractive index of an organic material and an electrode, large portion of the light emitted from an organic material layer is wasted, so that external quantum efficiency of the organic light emitting device becomes approximately 20%, with the result that its light extraction efficiency becomes low.

Therefore, a subwavelength photonic crystal structure is adopted in order to increase the light extraction efficiency. However, even in this case, there is a problem in that, owing to the periodicity of the subwavelength photonic crystal structures, the effect of increasing the light extraction efficiency is exhibited only over a specific wavelength range, and color change is caused with viewing angle.

Technical Solution

In accordance with a first aspect of the present invention, there is provided an organic light emitting device, including: a substrate; a nanostructure, having nonperiodic uneven fine patterns, formed on the substrate; a first electrode formed on the nanostructure; an organic material layer formed on the first electrode; and a second electrode formed on the organic material layer.

In accordance with a second aspect of the present invention, there is provided a method of manufacturing an organic light emitting device, comprising the steps of: forming a nanostructure having fine patterns on a substrate, the fine patterns being configured nonperiodically or having different sizes from each other; and sequentially forming a first electrode, an organic material layer and a second electrode on the nanostructure.

In accordance with a third aspect of the present invention, there is provided a method of manufacturing an organic light emitting device, including: forming a nanostructure forming layer on a substrate; pressing the nanostructure forming layer using a mold having uneven fine patterns to convert the nanostructure forming layer into a nanostructure; curing the nanostructure; detaching the mold from the substrate to form a nanostructure having nonperiodic uneven fine patterns; and sequentially forming a first electrode, an organic material layer and a second electrode on the nanostructure.

In accordance with a fourth aspect of the present invention, there is provided a method of manufacturing an organic light emitting device, including: forming a nanostructure forming layer on a substrate; exposing the nanostructure forming layer using an exposure mask provided with fine patterns to selectively cure a part of the nanostructure forming layer; removing the uncured portion of the nanostructure forming layer to form a nanostructure having nonperiodic uneven fine patterns; and sequentially forming a first electrode, an organic material layer and a second electrode on the nanostructure.

In accordance with a fifth aspect of the present invention, there is provided a method of manufacturing an organic light emitting device, including: forming nonperiodic nanostructured patterns on a substrate; and sequentially forming a first electrode, an organic material layer and a second electrode on the nanostructured patterns.

Advantageous Effects

In accordance with embodiments of the present invention, nanostructures, each having a nonperiodic uneven fine pattern, are formed between a substrate and a first electrode, so that the light wasted by total reflection and optical waveguide mode is extracted outwards. Accordingly, an organic light emitting device having improved external quantum efficiency can be realized without the diffraction pattern and color change with view angle.

BEST MODE FOR THE INVENTION

The organic light emitting device of the present invention, unlike a conventional organic light emitting device having a structure in which a first electrode, an organic material layer and a second electrode are sequentially laminated on a substrate, is summarized that a nanostructure having uneven fine patterns is formed between a substrate and a first electrode. The present invention can effectively solve conventional problems by the technical solution.

Here, the first electrode may be a cathode, the second electrode may be an anode, and the nanostructure may be made of an organic material, an inorganic material or a combination thereof.

Further, in the organic light emitting device of the present invention, a planarization layer for planarizing the fine patterns of the nanostructure may be formed between the nanostructure and the first electrode. This planariztion layer is made of a material having a different refractive index from that of the nanostructure.

Figure 2:
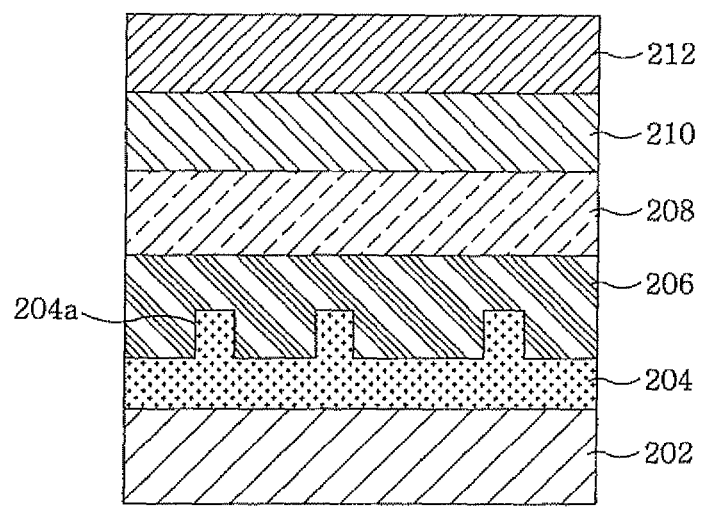
FIG. 2 is a cross sectional view of an organic light emitting device in accordance with an embodiment of the present invention.
Figure 6:
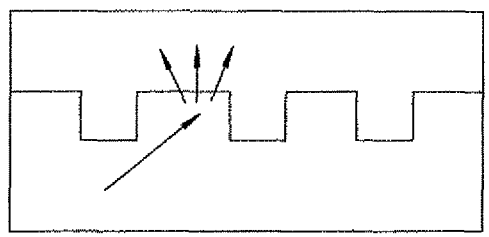
FIG. 6 is a schematic diagram showing the emission pathway of the light emitted from the interface of a substrate provided thereon with a nanostructure having fine patterns according to the present invention.

Specifically, in accordance with the organic light emitting device of the present invention, the nanostructure having uneven fine patterns is formed between the substrate and the first electrode as shown in FIG. 2, which leads to an improvement of the extraction efficiency of light emitted from the organic material layer. In particular, when the nanostructure has periodic fine patterns with a size larger than ½ of the wavelength of emitted light, the efficiency of light emitted outwards is further improved by help of scattering. As known from FIG. 6 which is a schematic view showing the emission pathway of the light emitted from the interface of a substrate provided thereon with a nanostructure having uneven fine patterns, the efficiency of the light emitted out of the substrate through the uneven fine patterns is greatly improved.

Further, when the height and cycle length of the fine patterns formed on the nanostructure match to the wavelength range of visible light, the effect of extracting visible light can be obtained. The reason for this is because the nanostructure having fine patterns in this wavelength range serves as a scatterer of visible light.

Moreover, when the fine patterns are formed such that the size and cycle length thereof are suitable for a wavelength of monochromatic light and then the light incident on the substrate is scattered, the scattering type of incident light is determined depending on the periodicity of the fine patterns. Because of the periodic fine patterns, the light extracted from the organic light emitting device to the outside of the substrate shows a specific pattern, and the intensity of the light changes with viewing angle.

That is, when light passes through the periodic fine patterns, the diffraction patterns are observed at specific positions. This phenomenon is also used for X-ray diffraction based on Fourier Transform. As such, when light passes through the periodic fine patterns, diffracted patterns are observed at specific positions because of constructive interference.

Figure 1:
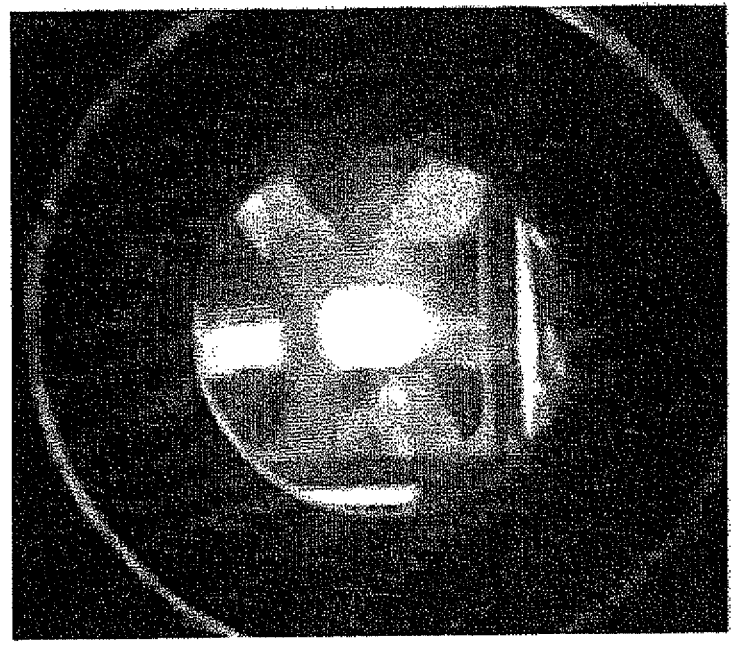
FIG. 1 is a photograph showing the emission pattern of a green organic light emitting device (OLED) using a photonic crystal having a periodicity of 520 nm.

When a nanostructure having the periodic fine patterns is formed between a substrate and an electrode of an organic light emitting device emitting white light that is the superposition of various monochromatic lights, based on this principle, the color change takes place depending on the angle, and, as shown in FIG. 1, a superposition diffraction pattern is observed depending on the periodic fine patterns.

That is, FIG. 1 shows the emission pattern of a green organic light emitting device (OLED) using a photonic crystal having a periodicity of 520 nm. As shown in FIG. 1, it can be seen that superposition diffraction pattern is observed at specific positions, and colors are changed.

Figure 27:
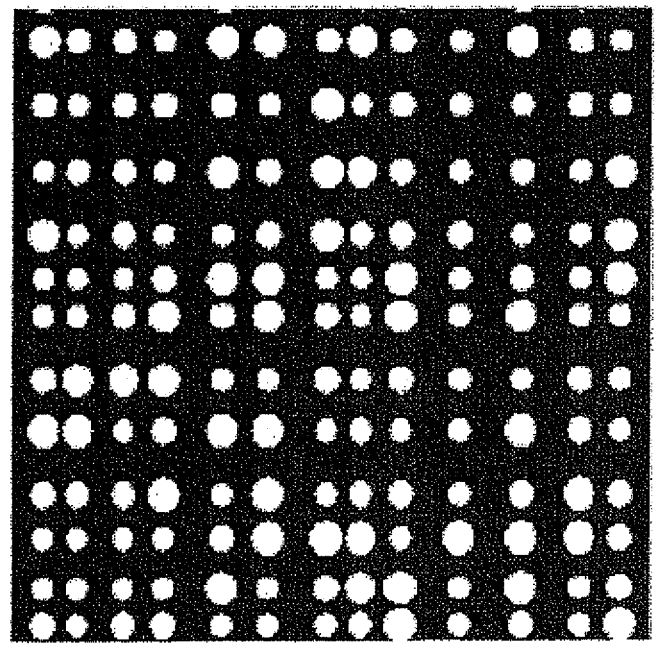
FIG. 27 is a photograph showing the result of the experiment of forming a nanostructure having a nonperiodic lattice structure.
Figure 28:
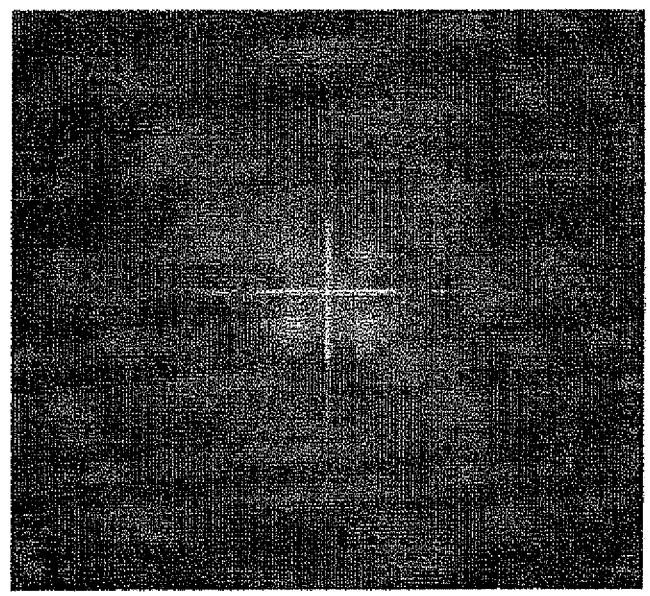
FIG. 28 is an image explaining a reciprocal lattice obtained by the Fourier transformation of the nonperiodic lattice structure.
Figure 29:
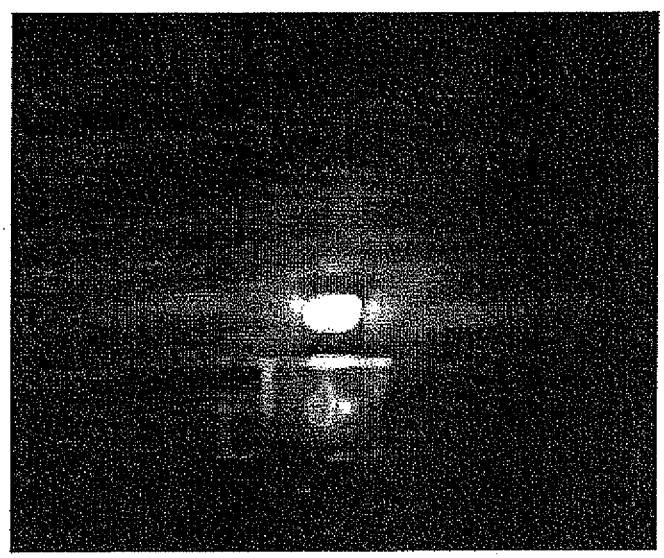
FIG. 29 is an image showing the alleviation of the color separation occurring when white light transmits a substrate, having a nonperiodic lattice structure.

Therefore, when a substrate provided thereon with periodic fine patterns is used to extract the white light, blue light, green light and red light are continuously separated (refer to FIGS. 27 to 29). Further, even when monocolor light with broad spectrum penetrates the substrate, colors change depending on the angle.

Figure 11:
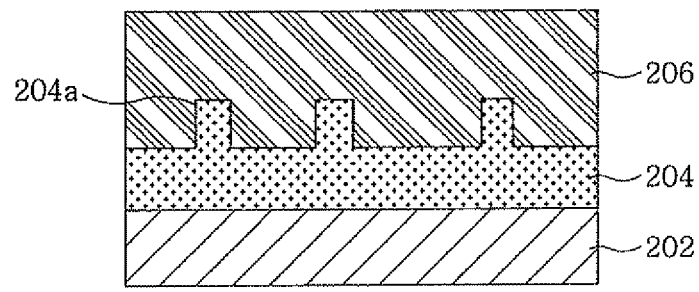

In order to prevent such a light diffraction phenomenon, nonperiodic fine patterns need to be formed on the substrate. As shown in FIG. 11, in the case of the substrate provided with the nonperiodic fine patterns, the Fourier Transform thereof looks amorphous. When the white light is irradiated to the substrate fabricated in this way, the color separation of the white light barely takes place.

Accordingly, the organic light emitting device of the present invention can prevent color change and diffraction pattern and also can be used to extract the white light because it uses the nonperiodic fine patterns.

When the nonperiodic fine patterns or random fine patterns are formed on a substrate, the light wasted by total reflection or waveguide mode can be extracted to air. In this case, Bragg scattering becomes weak due to the non-periodic distribution of the scatterers, and the extracted light is maintained as white light. That is, the extraction efficiency and homogeneity of emission pattern and colors of a white organic light emitting device can be improved by using the nonperiodic fine patterns (refer to FIGS. 30 to 32).

Hereinafter, embodiments of the present invention will be described in detail with reference to the accompanying drawings.

FIG. 2 is a cross sectional view of an organic light emitting device in accordance with an embodiment of the present invention.

Referring to FIG. 2, the organic light emitting device of the present invention includes a substrate 202 such as transparent glass and plastic; a nanostructure 204 having nonperiodic uneven fine patterns 204a formed on the substrate 202; and a planarization layer 206 for planarizing the fine patterns 204a formed on the nanostructure 204.

Here, the nanostructure 204 may be made of an organic material, an inorganic material and a combination thereof, and may be made of a thermosetting materials or a photocurable materials. The fine patterns 204a may be formed in the shape of a cylindrical column or a polygonal column, and may be nonperiodically or periodically arranged. That is, the fine patterns 204a may be configured such that the sizes thereof are equal to each other and the gaps therebetween are different from each other (i.e., distances therebetween are ununiform), or the gaps therebetween are equal to each other and the sizes thereof are different from each other (i.e., the sizes thereof are ununiform), or the gaps therebetween are different from each other and the sizes thereof are different from each other.

Here, it is preferable that the cylindrical column or polygonal column has a sidewall slope ranging from 35° to 90°. The reason for this is because light is entirely reflected at the interface of adjacent media when the refraction angle of light at the interface is greater than 90°. That is, as the difference in refractive index between media increases, the critical angle decreases, thus increasing the amount of totally-reflected light.

Further, the fine patterns 204a of the nanostructure 204 may be formed by nanoimprint lithography using a mold having uneven nanopatterns, an exposure process (for example, optical lithography) using a mask having fine patterns, ink-jet printing, offset printing, vacuum deposition, or the like. Here, the fine patterns 204a may have a height and a width ranging from 0.001 μm to 100 μm.

Figure 3:
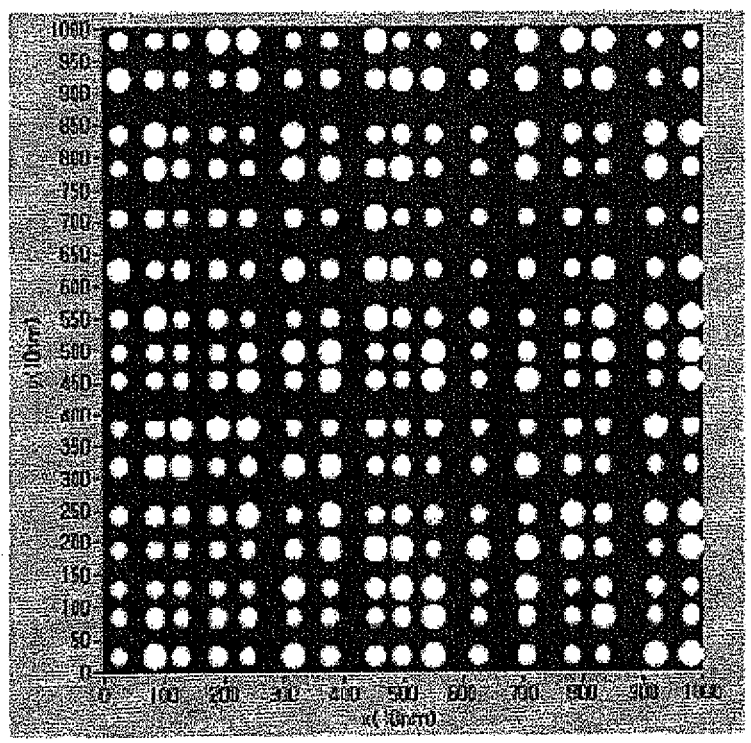
FIG. 3 is an image of a substrate for light extraction, on which nanostructures having predetermined sizes are nonperiodically arranged.
Figure 4:
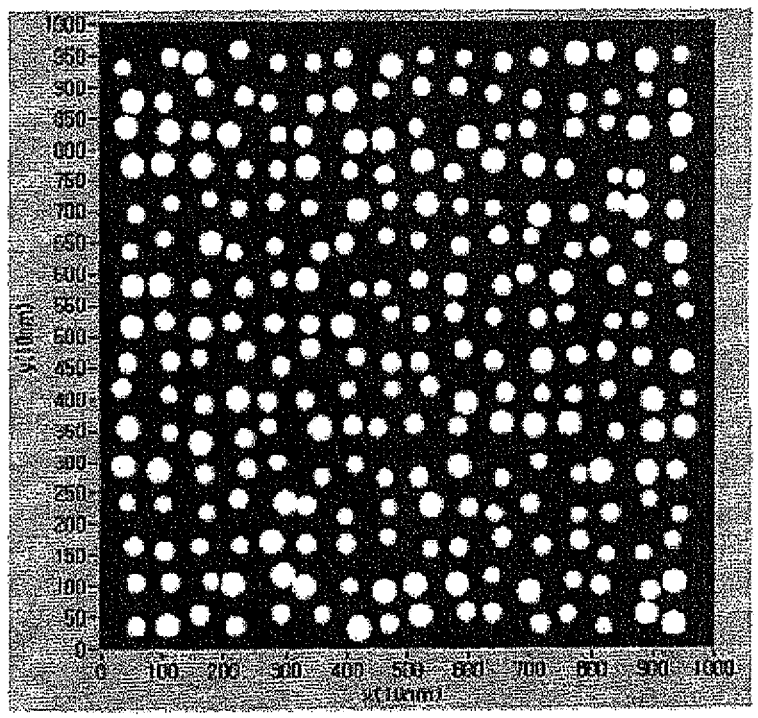
FIG. 4 is an image of a substrate for light extraction, on which nanostructures having various sizes are nonperiodically arranged.
Figure 5:
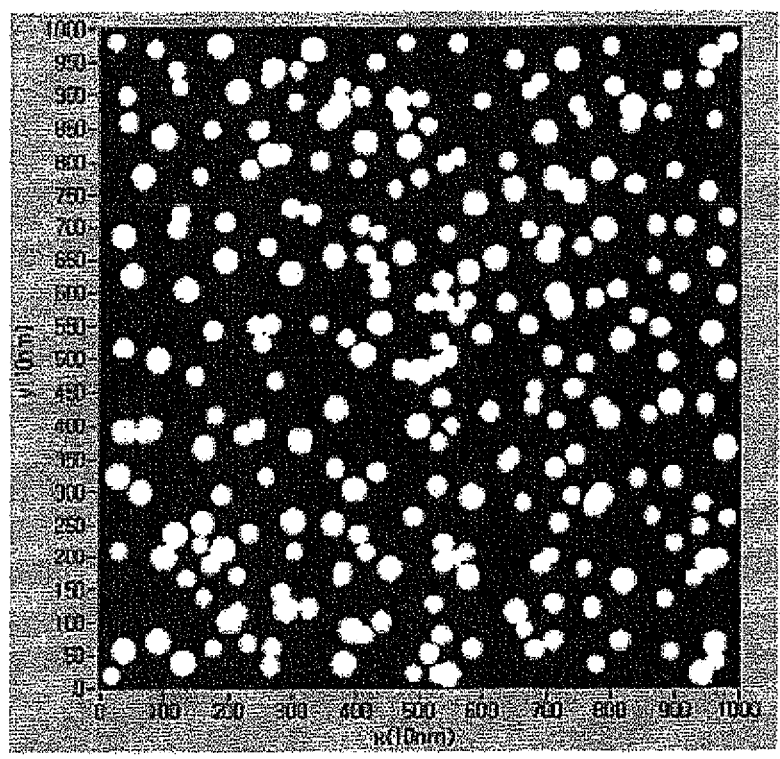
FIG. 5 is an image of a substrate for light extraction, on which nanostructures having various sizes are randomly arranged.

FIGS. 3 to 5 show various experimental results of arranging nanostructures (or optical structures) on a substrate used for light extraction. Here, FIG. 3 is a photograph of a substrate used for light extraction, on which nanostructures having predetermined sizes are nonperiodically arranged, FIG. 4 is a photograph of a substrate for light extraction, on which nanostructures having various sizes are nonperiodically arranged, and FIG. 5 is a photograph of a substrate for light extraction, on which nanostructures having various sizes are more randomly arranged.

That is, the inventors could ascertain from these experimental results that nanostructures having various sizes can be arranged on a substrate in various forms.

Next, the planarization layer 206 for planarizing the fine patterns 204a of the nanostructure 204 may be made of one of silicon nitride ($SiN_x$), zinc oxide (ZnO), titanium oxide ($TiO_2$), aluminum oxide ($Al_2O_3$) and the like, which are transparent materials having a different refractive index from that of the nanostructure 204. This planarization layer 206 may be formed using sputtering, deposition, evaporation polymerization, electron beam deposition, plasma deposition, chemical vapor deposition, a sol-gel process, spin coating, ink-jet printing, offset printing or the like.

As set for the above, the planarization layer 206 is made of a transparent material having a different refractive index from that of the nanostructure 204 (for example, a material having a refractive index equal to or larger than 1.6 when the nanostructure 204 is made of an organic material having a low optical refraction index). The planarization layer prohibits the collection of electric charges at the edges of the fine patterns 204a for the time of driving an organic light emitting device, thus preventing the performance of the organic light emitting device from deteriorating.

Further, a first electrode 208, an organic material layer 210 and a second electrode 212 are sequentially formed on the planarization layer 206. Here, the first electrode (cathode) 208 may be made of a transparent material, such as ITO, IZO, ZnO, $In_2O_3$, Ag, $TiO_2$ or the like, the organic material layer 210 may have a multilayer structure in which a hole injecting layer, a hole transport layer, a luminescent layer and an electron transport layer are sequentially laminated, and the second electrode 212 may be a reflective film made of Ag, Mg, Al, Pt, Pd, Au, Ni, Nd, Ir, Cr or a compound thereof or may be formed by applying ITO, IZO, ZnO or $In_2O_3$ onto the reflective film.

Meanwhile, it has been described in this embodiment that the nanostructure is made of an organic material having a low refractive index and the planarization layer is made of an inorganic material having a high refractive index, but the present invention is not limited thereto. Conversely, it will be understood that the nanostructure may be made of an organic material having a high refractive index and the planarization layer is made of an inorganic material having a low refractive index, or the nanostructure may be made of an organic material and the planarization layer may be made of a material having a lower refractive index than that of the organic material. That is, two or more kinds of materials having different refractive indexes may also be used.

Figure 7:
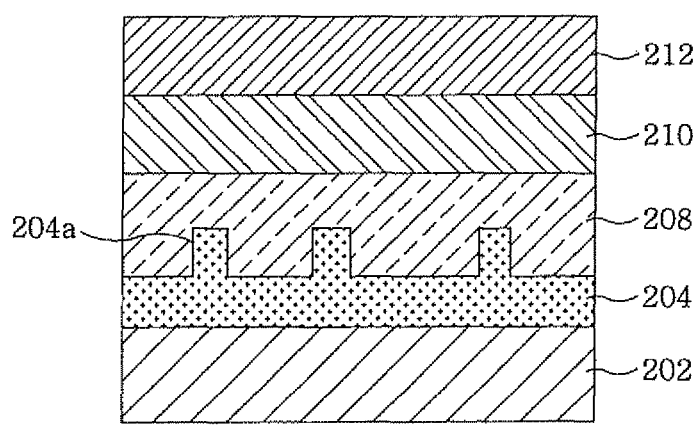
FIG. 7 is a cross sectional view of an organic light emitting device according to another embodiment of the present invention.

Further, it was described in this embodiment that the planarization layer 206 is disposed between the nanostructure 204 and the first electrode 208, but the present invention is not limited thereto. For example, as shown in FIG. 7, an organic light emitting device having a structure in which a planarization layer is not disposed between the nanostructure 204 and the first electrode 208 can be realized.

Therefore, in this embodiment, since the planarization layer is not additionally formed, the structure of an organic light emitting device can be simplified, and the manufacturing process thereof can also be simplified.

That is, the organic light emitting device of the present invention may have a first structure (See, FIG. 2) in which the planarization layer is formed between the nanostructure and the first electrode and a second structure (See, FIG. 7) in which the first electrode is directly formed on the nanostructure without forming the planarization layer. The second structure is advantageous in that the overall structure of an organic light emitting device and the manufacturing is process thereof can be simplified because the planarization layer does not exist, but is disadvantageous in that electric current concentrates at the edge of the first electrode, and thus current leakage occurs, thereby decreasing the light efficiency of the organic light emitting device to some degree.

On the other hand, the first structure is disadvantageous in that the overall structure of an organic light emitting device and the manufacturing process thereof are somewhat complicated compared to those of the second structure because the planarization layer exists, but is advantageous in that the occurrence of current leakage attributable to the concentration of electric current at the edge of the first electrode can be basically prevented because edges are not formed on the first electrode due to the planarization layer, so that the light efficiency of the organic light emitting device can be further improved.

Therefore, in accordance with an embodiment of the present invention, the first structure and the second structure may be selectively employed depending on the use and purpose of an organic light emitting device. For example, when a cheap product is required in spite of its somewhat low light efficiency, an organic light emitting device having the second structure can be used. Further, when a product having high light efficiency is required in spite of being somewhat expensive, an organic light emitting device having the first structure can be used.

Hereinafter, a series of processes for manufacturing the organic light emitting device having the above structure will be described.

FIGS. 8 to 13 show a method of manufacturing an organic light emitting device in accordance with a first embodiment of the present invention.

Figure 8:
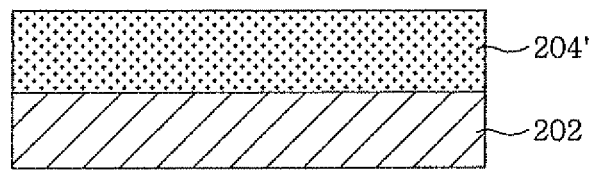
FIGS. 8 to 13 show a method of manufacturing an organic light emitting device in accordance with a first embodiment of the present invention.

Referring to FIG. 8, a nanostructure forming layer 204' having a predetermined thickness is formed on a substrate 202 by deposition or the like. Here, the nanostructure forming layer 204' may be made of, e.g., a thermosetting or photocurable (ultraviolet-curable) organic material, inorganic material or a combination thereof, and may be formed by spin coating, vacuum deposition, spreading, ink-jet printing or the like.

Figure 9:
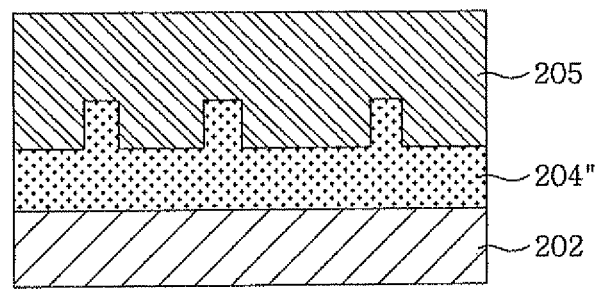

Subsequently, as shown in FIG. 9, a mold 205 having uneven nanopatterns is provided, and then the patterned surface of the mold 205 is brought into contact with the nanostructure forming layer 204' to press the nanostructure forming layer 204' by a predetermined pressure for a predetermined amount of time, thereby converting the nanostructure forming layer 204' into a nanostructure 204" having nonperiodic uneven fine patterns. That is, a part of the nanostructure forming layer 204' having fluidity is pushed into the depressed patterned surface of the mold 205 by the pressure of contact, and thus the nanostructure forming layer 204' is converted into the nanostructure 204".

Figure 10:
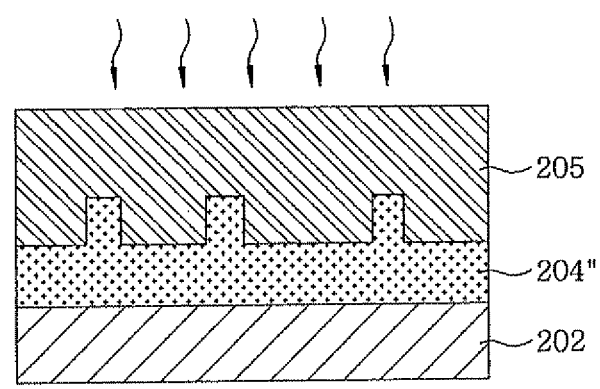

Subsequently, as shown in FIG. 10, the nanostructure 204" is cured by performing a thermosetting or a photocurable (ultraviolet curing) process which irradiates heat or light (ultraviolet) toward the nanostructure 204" from the rear side of the mold 205.

Thereafter, as shown in FIG. 11, the mold 205 is detached from the substrate 202, thus completing a nanostructure 204 having uneven fine patterns 204a.

Meanwhile, the nanopatterns formed on the mold 205 may be nonperiodic to or periodic nanopatterns in order that the fine patterns 204a formed on the nanostructure 204 may be nonperiodic or periodic fine patterns. That is, the fine patterns 204a may be formed in the shape of a cylindrical column or a polygonal column, and may be arranged nonperiodically or periodically.

For example, the fine patterns 204a may be configured such that the sizes thereof are equal to each other and the gaps therebetween are different from each other (i.e., distances therebetween are ununiform), the gaps therebetween equal to each other and the sizes thereof are different from each other (i.e., the sizes thereof are ununiform), or the gaps therebetween different from each other and the sizes thereof are different from each other. Further, the fine patterns 204a may have a height and a width ranging from 0.001 μm to 100 μm.

Further, the cylindrical column or polygonal column constituting the fine patterns 204a may have a sidewall slope ranging from 35° to 90°. The reason for this is because light is entirely reflected at the interface of adjacent media when the refraction angle of light at the interface thereof is more than 90°.

Figure 12:
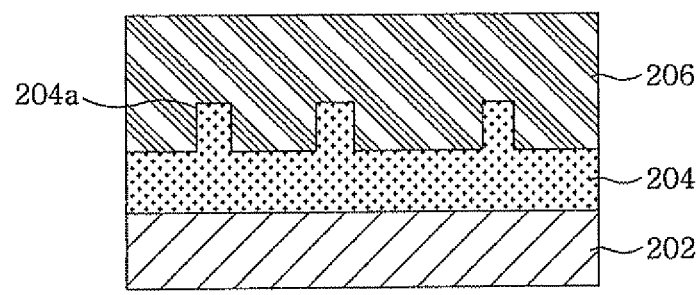

Subsequently, as shown in FIG. 12, a planarization layer 206 is formed on the nanostructure 204 to a predetermined thickness by deposition such that the fine patterns 204a of the nanostructure 204 are completely buried.

Here, the planarization layer 206 has a different refractive index from that of the nanostructure 204. This planarization layer 206 may be formed using sputtering, thermal evaporation, evaporation polymerization, electron beam deposition, plasma deposition, chemical vapor deposition, a sol-gel process, spin coating, ink-jet printing, offset printing or the like. Further, the planarization layer 206 may be made of one of an organic material, an inorganic material and a combination thereof, and the combination thereof may include a mixture or compound of a polymer and an inorganic oxide, such as a mixture of polymethylmethacrylate and titanic.

Figure 13:
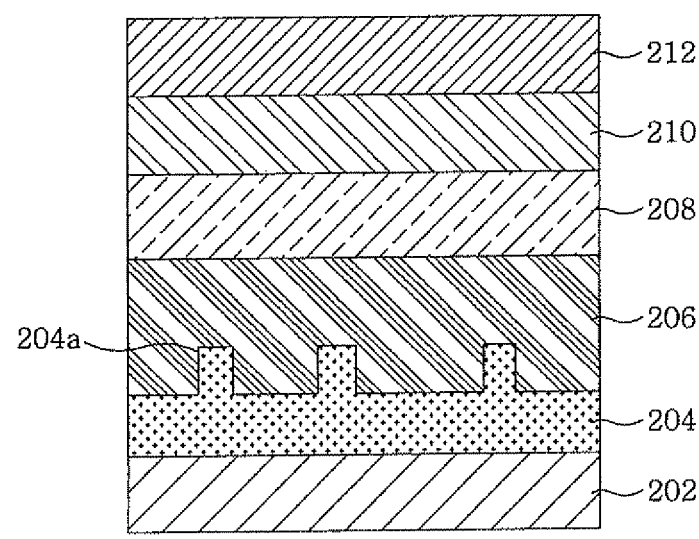

Next, as shown in FIG. 13, a first electrode 208, an organic material layer 210 and a second electrode are sequentially formed on the planarization layer 206 by deposition, thus finishing the manufacture of an organic light emitting device. Here, the first electrode 208 may be a transparent ITO electrode (cathode), the organic material layer 210 may have a multilayer structure in which a hole injecting layer, a hole transport layer, a luminescent layer and an electron transport layer are sequentially laminated, and the second electrode may be an anode made of aluminum (Al) or the like.

Meanwhile, it was described in this embodiment that the patterned surface of a mold having nanopatterns is directly brought into contact with a nanostructure forming layer to press the nanostructure forming layer, but the present invention is not limited thereto. For example, this pressure-contact process may be conducted after forming an antistripping film on the patterned surface of the mold. The antistripping film serves to prevent a part of the nanostructure forming layer from being stripped from the substrate together with the mold when the mold is detached from the substrate. Here, the antistripping film, e.g., may include a self-assembled monolayer, a teflon film or the like, which is made of a material having relatively low surface energy. The self-assembled monolayer, a teflon film or the like may be formed by vapor deposition, spin coating or the like.

Further, it has been described in this embodiment that a nanostructure having fine patterns is formed, a planarization layer for planarization the fine patterns is formed on the nanostructure, and then a first electrode is formed on the planarization layer, but the present invention is not limited thereto. As previously described with reference to FIG. 7, it is also possible to modify this embodiment in such a manner that a nanostructure is formed, and then a first electrode is directly formed on the nanostructure without forming a planarization layer.

In this case, since a process of forming a planarization layer is omitted, the structure of an organic light emitting device can be simplified, and the manufacturing process thereof can also be simplified.

FIGS. 14 to 19 show a method of manufacturing an organic light emitting device in accordance with a second embodiment of the present invention.

Figure 14:
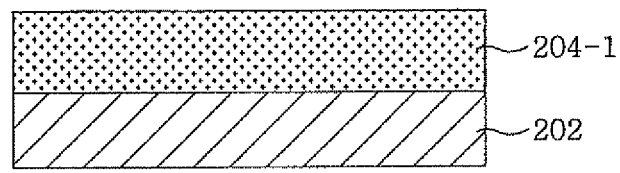
FIGS. 14 to 19 show a method of manufacturing an organic light emitting device in accordance with a second embodiment of the present invention.

Referring to FIG. 14, a nanostructure forming layer 204-1 having a predetermined thickness is formed on a substrate 202 by deposition or the like. The nanostructure forming layer 204-1 may be formed by spin coating, vacuum deposition, spreading, ink-jet printing or the like.

Subsequently, a curable nanostructure forming layer 204-2 having a predetermined thickness is formed on the nanostructure forming layer 204-1 by deposition. Here, the curable nanostructure forming layer 204-2 may be made of a thermosetting or photocurable (ultraviolet-curable) organic material, inorganic material or a combination thereof, and may be formed by spin coating, vacuum deposition, spreading, ink-jet printing or the like.

Figure 15:
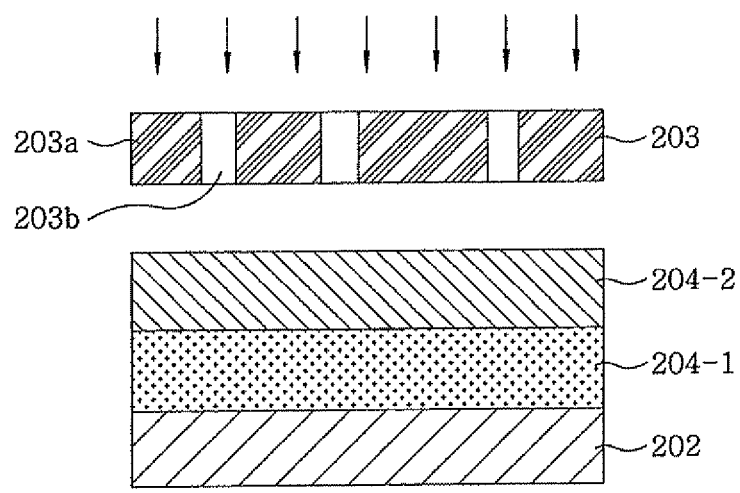

Subsequently, as shown in FIG. 15, an exposure mask 203 having fine patterns is aligned over the curable nanostructure forming layer 204-2, and then an exposure process (for example, optical lithography or the like) is conducted. In the exposure mask 203, the reference numeral '203a' indicates a region through which heat or light does not pass, and the reference numeral '203b' indicates a region through which heat or light passes.

Figure 16:
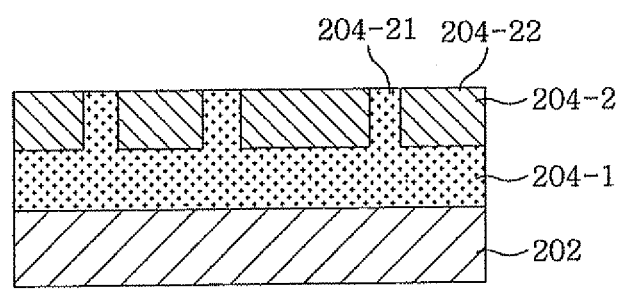

Therefore, when the exposure process is conducted using the exposure mask 203, as shown in FIG. 16, a part of the curable nanostructure forming layer 204-2 (that is, the portion thereof corresponding to the region 203b of the exposure mask 203) is cured. That is, the curable nanostructure forming layer 204-2 is divided into a cured portion 204-21 and an uncured portion 204-22.

Figure 17:
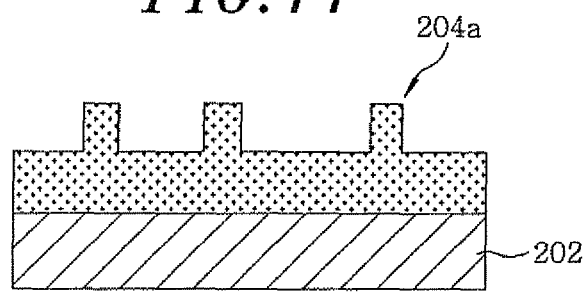

Subsequently, as shown in FIG. 17, a nanostructure 204 having nonperiodic uneven fine patterns 204a is formed by selectively removing the uncured portion 204-22 of the curable nanostructure forming layer 204-2 by a wet etching process.

As described above, the nanostructure 204 formed on the substrate 202 has the same structure, size and function as those of the nanostructure of the first embodiment. Therefore, in order to avoid a duplicate description, detailed description of the structure, size and function of the nanostructure will be omitted.

Figure 18:
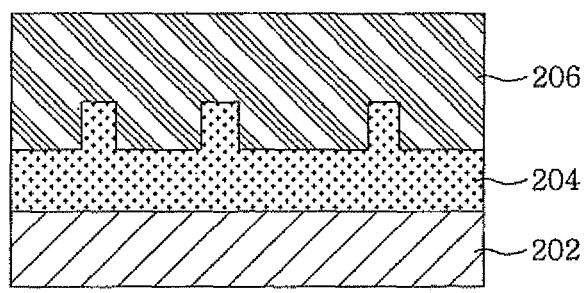

Subsequently, as shown in FIG. 18, a planarization layer 206 is formed on the nanostructure 204 to a predetermined thickness by deposition such that the fine patterns 204a of the nanostructure 204 are completely buried.

Here, the planarization layer 206 may be made of one of silicon nitride ($SiN_x$), zinc oxide (ZnO), titanium oxide ($TiO_2$), aluminum oxide ($Al_2O_3$) and the like, which are transparent materials having a different refractive index from that of the nanostructure 204. This planarization layer 206 may be formed using sputtering, deposition, evaporation polymerization, electron beam deposition, plasma deposition, chemical vapor deposition, a sol-gel process, spin coating, ink-jet printing, offset printing or the like.

Figure 19:
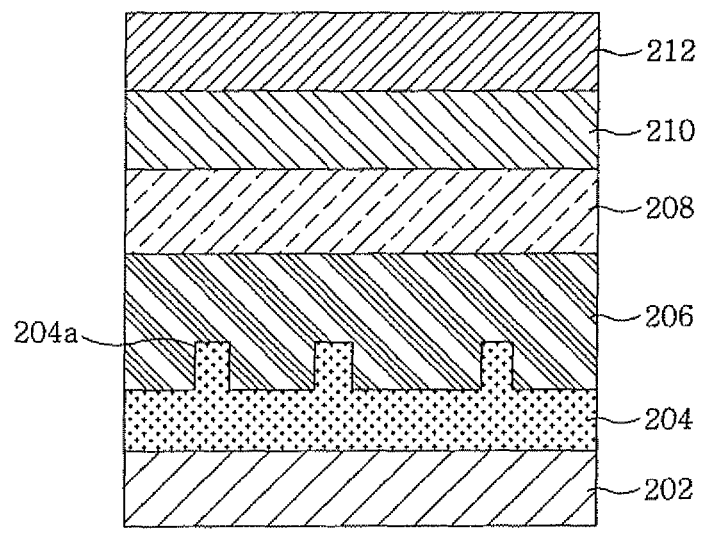

Finally, as shown in FIG. 19, a first electrode 208, an organic material layer 210 and a second electrode are sequentially formed on the planarization layer 206 by deposition, thus finishing the manufacture of an organic light emitting device. Here, the first electrode 208 may be a transparent ITO electrode (cathode), the organic material layer 210 may have a multilayer structure in which a hole injecting layer, a hole transport layer, a luminescent layer and an electron transport layer are sequentially laminated, and the second electrode 212 may be an anode made of aluminum (Al) or the like.

Meanwhile, it has been described in this embodiment that a nanostructure having fine patterns is formed by an exposure process, a planarization layer for planarizing the fine patterns is formed on the nanostructure, and then a first electrode is formed on the planarization layer, but the present invention is not limited thereto. Similarly to the first embodiment, it is also possible to modify this embodiment in such a manner that a nanostructure is formed, and then a first electrode is directly formed on the nanostructure without forming a planarization layer, and that the effects obtained therefrom are the same as those obtained from the first embodiment.

FIGS. 20 to 23 show a method of manufacturing an organic light emitting device in accordance with a third embodiment of the present invention.

Figure 20:
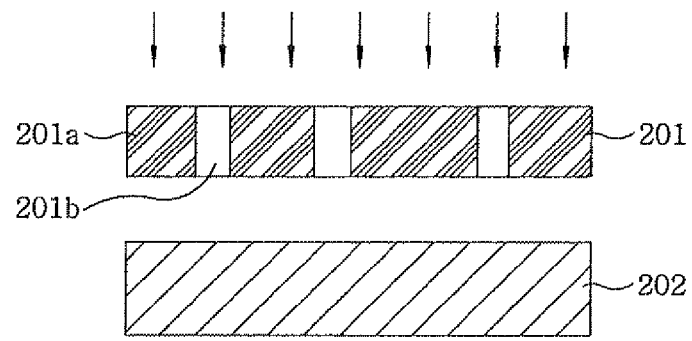
FIGS. 20 to 23 show a method of manufacturing an organic light emitting device in accordance with a third embodiment of the present invention.

Referring to FIG. 20, an evaporation mask 201 is aligned over a substrate 202. The evaporation mask 201 includes a nanostructure forming material blocking region 201a and a nanostructure forming material passing region 201b.

Figure 21:
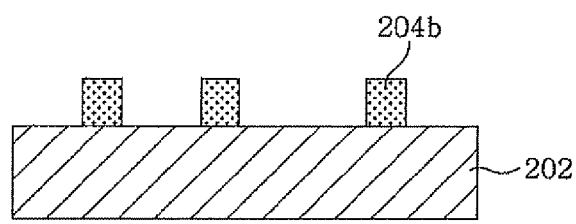

Therefore, when the evaporation mask 201 is aligned over the substrate 202 and then a deposition process is conducted, a nanostructure forming material passing through the nanostructure forming material passing region 201b is deposited on the position of the substrate 201 corresponding to the nanostructure forming material passing region 201b. As a result, nonperiodic nanopatterns 204b are formed on the substrate as shown in FIG. 21. Here, the nanopatterns 204b have the same structure, size and function as those of the nanostructures of the above-mentioned embodiments.

Figure 22:
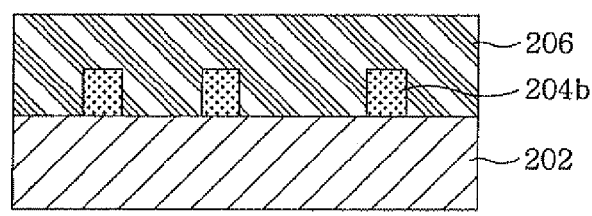

Subsequently, as shown in FIG. 22, a planarization layer 206 is formed on the substrate 202 to a predetermined thickness by deposition such that the fine patterns 204b are completely buried. Here, the planarization layer 206 may be formed using the same material and method as the above-mentioned embodiments.

Figure 23:
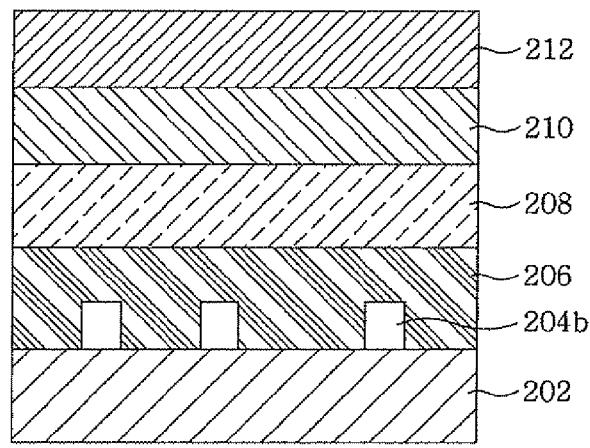

Finally, as shown in FIG. 23, a first electrode 208, an organic material layer 210 and a second electrode are sequentially formed on the planarization layer 206 by deposition, thus finishing the manufacture of an organic light emitting device. Here, the first electrode 208 may be a transparent ITO electrode (cathode), the organic material layer 210 may have a multilayer structure in which a hole injecting layer, a hole transport layer, a luminescent layer and an electron transport layer are sequentially laminated, and the second electrode 212 may be an anode made of aluminum (Al) or the like.

Meanwhile, it was described in this embodiment that nonperiodic nanopatterns are formed on a substrate by a selective deposition process using an evaporation mask, but the present invention is not limited thereto. It goes without saying that nonperiodic nanopatterns can be directly and spontaneously formed on a substrate using spin coating, spreading, ink-jet printing, offset printing, scanning microscopy or the like without conducting a deposition process requiring an evaporation mask, and that subsequent processes can be conducted in the same manner as the third embodiment.

Further, it was described in this embodiment that nonperiodic nanopatterns are formed on a substrate by a selective deposition process using an evaporation mask, a planarization layer for planarizing the nanopatterns is formed on the nanopatterns, and then a first electrode is formed on the planarization layer, but the present invention is not limited thereto. Similarly to the first embodiment, it is possible to modify this embodiment that nanopatterns are formed, and then a first electrode is directly formed on the nanopatterns without forming a planarization layer. Further, the effects obtained therefrom are the same as those obtained from the first embodiment.

Next, the present inventors carried out an experiment wherein a nanostructure was formed using a silicon mask engraved with nonperiodic fine patterns and then an organic light emitting device was manufactured using the nanostructure.

That is, a transparent glass substrate or a transparent plastic substrate was cleaned, and then an acrylic photocurable material layer (organic material layer) having a thickness of 1 μm was formed on the substrate using spin coating. Subsequently, the acrylic photocurable material layer was pressed by a silicon mask engraved with nonperiodic fine patterns, and was then irradiated with 10 mW ultraviolet light for 5 minutes through the back side of the silicon mask to be cured. Thereafter, the silicon mask was detached from the substrate, thus forming a nanostructure on the substrate.

Subsequently, ZnO sol of several tens of nanometers was applied onto the nanostructure using spin coating, and then a solvent was annealed at 150° C. to form an inorganic material film having a relatively high refractive index six times.

Subsequently, a transparent electrode (IZO) was formed on the inorganic material film to a thickness of 150 nm by sputtering, and then an organic luminescent material was deposited onto the transparent electrode by thermal evaporation to manufacture an organic light emitting device.

When white light penetrated the organic light emitting device manufactured in this way, it could be ascertained that the white light seen from the direction opposite to the penetration direction spread radially.

Further, the present inventors carried out another experiment wherein an organic light emitting device was manufactured using a silicon mask engraved with periodic fine patterns each having a hexagonal lattice structure of 520 nm.

In the organic light emitting devices manufactured for the two experiments, images of white light penetrating a substrate were observed, and the results thereof are shown in FIGS. 24 to 32.

Referring to FIGS. 24 to 32, in the case of the second experiment, it can be seen that a beam of white light is separated into its constituent spectrum of colors around a substrate, and diffracted at a predetermined angle. On the other hand, in the case of the first experiment, it can be seen that white light collects at the center of a substrate, and color variation is very small with viewing angle and position.

Figure 24:
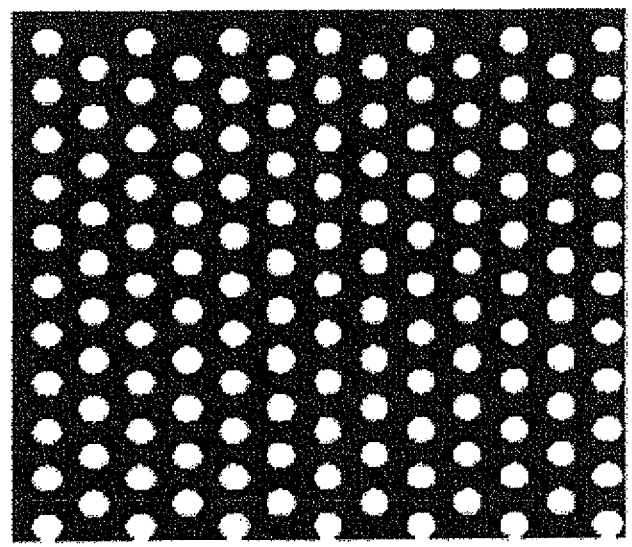
FIG. 24 is a photograph showing the result of the experiment of forming a nanostructure having a triangular lattice structure.
Figure 25:
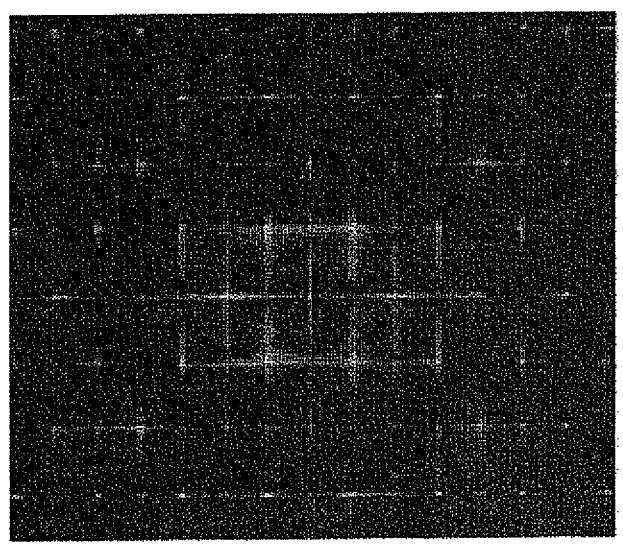
FIG. 25 is a view explaining a reciprocal lattice obtained by the Fourier transformation of the triangular lattice structure.
Figure 26:
FIG. 26 is an image showing a color separation occurring when transmitting white light into a substrate for light extraction, having a triangular lattice structure.

More specifically, the present inventors carried out experiments wherein a nanostructure having a triangular lattice structure was formed, and the results thereof are shown in FIGS. 24 to 26.

That is, FIG. 24 is a photograph showing the results of the experiment of forming a nanostructure having a triangular lattice structure, FIG. 25 is a view explaining a reciprocal lattice obtained by the Fourier transformation of the triangular lattice structure, and FIG. 26 is a graph showing the color separation occurring in the transmitted light when white beam is irradiated on the substrate having a triangular lattice structure.

Further, the present inventors carried out experiments wherein a nanostructure having a nonperiodic lattice structure was formed, and the results thereof are shown in FIGS. 27 to 29.

That is, FIG. 27 is a photograph showing the results of an experiment wherein a nanostructure having a nonperiodic lattice structure was formed, FIG. 28 is a view explaining a reciprocal lattice obtained by the Fourier transformation of the nonperiodic lattice structure, and FIG. 29 is a graph showing the alleviation of the color separation in the transmitted light when white beam is irradiated on the substrate having a nonperiodic lattice structure.

Figure 30:
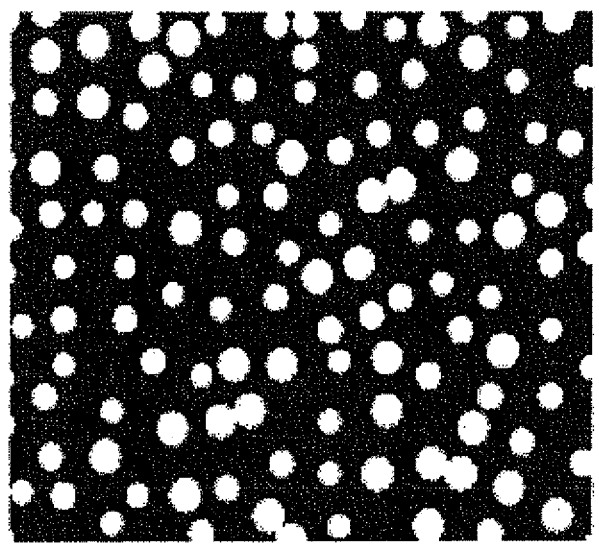
FIG. 30 is a photograph showing the result of the experiment of forming a nanostructure having a nonperiodic lattice structure.
Figure 31:
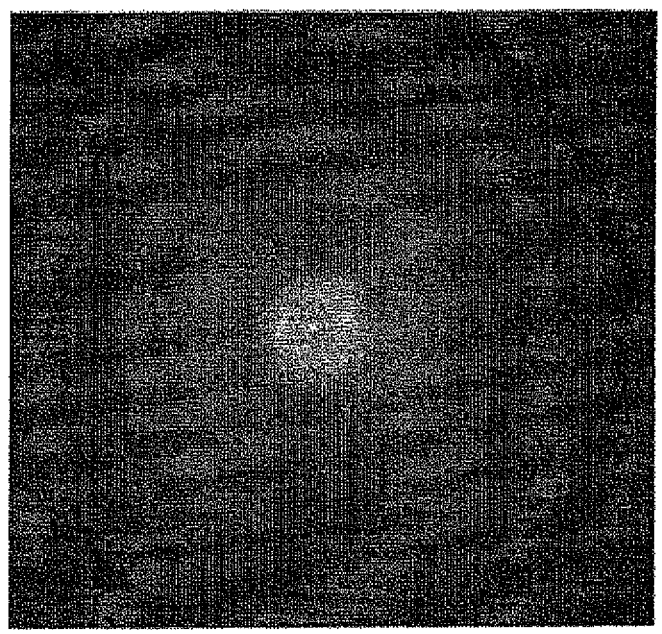
FIG. 31 is a view explaining a reciprocal lattice obtained by the Fourier transformation of the nonperiodic lattice structure.
Figure 32:
FIG. 32 is an image showing the disappearance of the color separation occurring when white light penetrates a substrate for light extraction, having a nonperiodic lattice structure.

Furthermore, the present inventors carried out experiments wherein a nanostructure having a nonperiodic lattice structure was formed, and the results thereof are shown in FIGS. 30 to 32.

That is, FIG. 30 is a photograph showing the results of the experiment wherein a nanostructure having a nonperiodic lattice structure was formed, FIG. 31 is a view explaining a reciprocal lattice obtained by the Fourier transformation of the nonperiodic lattice structure, and FIG. 32 is a graph showing the disappearance of the color separation in the transmitted light when white beam is irradiated on the substrate having a nonperiodic lattice structure, respectively.

While the embodiments of the present invention have been shown and described with respect to the embodiments, it will be understood by those skilled in the art that various changes and modifications may be made without departing from the scope of the invention as defined in the following claims.

The invention claimed is:

1. An organic light emitting device, comprising:
    a substrate;
    a nanostructure having nonperiodic uneven fine patterns formed on the substrate;
    a first electrode formed on the nanostructure;
    an organic material layer formed on the first electrode; and
    a second electrode formed on the organic material layer,
    wherein the nanostructure is made of an organic material,
    wherein each of the fine patterns is formed in the shape of a cylindrical column, a polygonal column or a cone, in which the cylindrical column or polygonal column has a sidewall slope ranging from 35° to 90°, and has a height and a width ranging from 0.001 μm to 100 μm.

2. The organic light emitting device of claim 1, further comprising:
    a planarization layer for planarizing the fine patterns between the nanostructure and the first electrode,
    wherein the planarization layer has a refractive index smaller or larger than that of the nanostructure.

3. The organic light emitting device of claim 1, wherein the planarization layer is made of any one of an organic material, an inorganic material and a combination thereof, and the combination thereof includes a mixture or compound of a polymer and an inorganic oxide, such as a mixture of polymethylmethacrylate and titania.

4. The organic light emitting device of claim 1, wherein the nanostructure are formed by a thermosetting material or a photocurable material.

5. The organic light emitting device of claim 1, wherein the fine patterns are nonperiodically configured such that sizes thereof are different from each other and gaps therebetween are different from each other.

6. A method of manufacturing an organic light emitting device, comprising:
    forming a nanostructure having fine patterns on a substrate, the fine patterns being configured nonperiodically or having different sizes from each other; and
    sequentially forming a first electrode, an organic material layer and a second electrode on the nanostructure,
    wherein the nanostructure is made of an organic material, and
    wherein the method further comprises:
    forming a nanostructure forming layer on the substrate;
    pressing the nanostructure forming layer using a mold having uneven fine patterns to convert the nanomaterial layer into a nanostructure;
    curing the nanostructure; and
    detaching the mold from the substrate to form a nanostructure having nonperiodic uneven fine patterns.

7. The method of claim 6, wherein the fine patterns are formed by a deposition process using an evaporation shadow mask including a nanostructure forming material blocking region and a nanostructure forming material passing region.

8. The method of claim 6, further comprising:
    forming a planarization layer for planarizing the fine patterns after forming the nanostructure,
    wherein the planarization layer has a refractive index smaller or larger than that of the nanostructure.

9. The method of claim 8, wherein the planarization layer is formed using one of sputtering, thermal evaporation, evaporation polymerization, electron beam deposition, plasma deposition, chemical vapor deposition, a sal-gel process, spin coating, ink-jet printing and offset printing.

10. The method of claim 9, wherein the planarization layer is made of one of an organic material, an inorganic material and a combination thereof, and the combination thereof includes a mixture or compound of a polymer and an inorganic oxide, such as a mixture of polymethylmethacrylate and titania.

11. The method of claim 6, wherein the curing of the nanostructure is performed using photocuring or thermocuring.

12. The method of claim 6, wherein the nanostructure forming layer is made of a thermosetting material or a photocurable material.

13. The method of claim 6, wherein the nanostructure forming layer is formed using one of spin coating, vacuum deposition, spreading, ink-jet printing, and offset printing.

14. The method of claim 6, wherein the fine patterns are nonperiodically configured such that sizes thereof are different from each other and gaps therebetween are different from each other.

15. The method of claim 6, wherein each of the fine patterns is formed in the shape of a cylindrical column, a polygonal column or a cone, in which the cylindrical column or polygonal column has a sidewall slope ranging from 35° to 90°, and has a height and a width ranging from 0.001 μm to 100 μm.

16. A method of manufacturing an organic light emitting device, comprising:
   forming a nanostructure having fine patterns on a substrate, the fine patterns being configured nonperiodically or having different sizes from each other; and
   sequentially forming a first electrode, an organic material layer and a second electrode on the nanostructure,
   wherein the nanostructure is made of an organic material, and
   wherein the method further comprises:
   forming a nanomaterial layer on the substrate;
   exposing the nanostructure forming layer using an exposure mask having fine patterns to selectively cure a part of the nanostructure forming layer; and
   removing the uncured portion of the nanostructure forming layer to form a nanostructure having nonperiodic uneven fine patterns.

* * * * *